(12) United States Patent
Wierer et al.

(10) Patent No.: US 10,672,949 B2
(45) Date of Patent: *Jun. 2, 2020

(54) LIGHT EMITTING DEVICE INCLUDING POROUS SEMICONDUCTOR

(71) Applicant: LUMILEDS LLC, San Jose, CA (US)

(72) Inventors: Jonathan J. Wierer, Pleasanton, CA (US); John E. Epler, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/148,652

(22) Filed: Oct. 1, 2018

(65) Prior Publication Data
US 2019/0103511 A1  Apr. 4, 2019

Related U.S. Application Data

(60) Continuation of application No. 15/170,161, filed on Jun. 1, 2016, now Pat. No. 10,090,435, which is a
(Continued)

(51) Int. Cl.
*H01L 33/12* (2010.01)
*H01L 21/02* (2006.01)
(Continued)

(52) U.S. Cl.
CPC .......... *H01L 33/12* (2013.01); *H01L 21/0254* (2013.01); *H01L 21/02458* (2013.01);
(Continued)

(58) Field of Classification Search
CPC ............... H01L 33/12; H01L 21/02458; H01L 21/02513; H01L 21/0254; H01L 33/0025;
(Continued)

(56) References Cited

U.S. PATENT DOCUMENTS 5,679,965 A * 10/1997 Schetzina .............. B82Y 20/00
257/103
5,777,350 A  7/1998 Nakamura et al.
(Continued)

FOREIGN PATENT DOCUMENTS

WO  2005/038889  4/2005
WO  2009/038324  3/2009

OTHER PUBLICATIONS

Chia-Feng Lin et al., "Enhanced Light Output in Nitride-Based Light-Emitting Diodes by Roughening the MesaSidewall," IEEE Photonics Technology Letters, vol. 17, No. 10, Oct. 2005, pp. 2038-2040.
(Continued)

*Primary Examiner* — Hrayr A Sayadian
(74) *Attorney, Agent, or Firm* — Volpe and Koenig, P.C.

(57) ABSTRACT

A device comprising a semiconductor structure comprising a light emitting layer disposed between an n-type region and a p-type region is disclosed. The device comprises a porous region. The device comprises a first layer disposed between the light emitting layer and the porous region. The device comprises a mask layer disposed between the porous region and the first layer. The device comprises a plurality of openings formed in the mask layer.

9 Claims, 3 Drawing Sheets

Related U.S. Application Data division of application No. 13/084,679, filed on Apr. 12, 2011, now Pat. No. 9,385,265, which is a continuation of application No. 11/950,211, filed on Dec. 4, 2007, now Pat. No. 7,928,448.

(51) Int. Cl.
| | |
|---|---|
| *H01L 33/00* | (2010.01) |
| *H01L 33/16* | (2010.01) |
| *H01L 33/06* | (2010.01) |
| *H01L 33/24* | (2010.01) |
| *H01L 33/32* | (2010.01) |
| H01L 33/38 | (2010.01) |

(52) U.S. Cl.
CPC ...... *H01L 21/02513* (2013.01); *H01L 33/007* (2013.01); *H01L 33/0025* (2013.01); *H01L 33/0075* (2013.01); *H01L 33/0079* (2013.01); *H01L 33/06* (2013.01); *H01L 33/16* (2013.01); *H01L 33/24* (2013.01); *H01L 33/32* (2013.01); *H01L 21/0237* (2013.01); *H01L 33/382* (2013.01); *H01L 2924/0002* (2013.01)

(58) Field of Classification Search
CPC ............... H01L 33/007; H01L 33/0075; H01L 33/0079; H01L 33/06; H01L 33/16; H01L 33/24; H01L 33/32; H01L 21/0237; H01L 33/382; H01L 2924/0002
USPC ................ 257/13, 79, E21.566; 438/26
See application file for complete search history.

(56) References Cited

U.S. PATENT DOCUMENTS

| 6,043,140 | A | 3/2000 | Kawai et al. |
|---|---|---|---|
| 6,261,929 | B1 | 7/2001 | Gehrke et al. |
| 6,274,924 | B1 | 8/2001 | Carey et al. |
| 6,335,546 | B1 | 1/2002 | Tsuda et al. |
| 6,515,313 | B1* | 2/2003 | Ibbetson ................ H01L 33/16 257/101 |
| 6,579,359 | B1 | 6/2003 | Mynbaeva et al. |
| 6,924,159 | B2 | 8/2005 | Usui et al. |
| 7,118,934 | B2 | 10/2006 | Oshima et al. |
| 7,829,913 | B2 | 11/2010 | Shibata et al. |
| 7,928,448 | B2* | 4/2011 | Wierer, Jr. ............. H01L 33/32 257/79 |
| 9,385,265 | B2* | 7/2016 | Wierer, Jr. ............. H01L 33/32 |
| 2002/0158259 | A1 | 10/2002 | Ono et al. |
| 2003/0160246 | A1* | 8/2003 | Narayan ................ B82Y 20/00 257/79 |
| 2004/0184497 | A1 | 9/2004 | Kneissl et al. |
| 2004/0206967 | A1 | 10/2004 | Oshima et al. |
| 2005/0161696 | A1 | 7/2005 | Yuri |
| 2005/0173725 | A1 | 8/2005 | Kunisato et al. |
| 2006/0046511 | A1* | 3/2006 | Shibata ................ C30B 25/02 438/767 |
| 2006/0079070 | A1 | 4/2006 | Letertre et al. |
| 2006/0154451 | A1 | 7/2006 | Park |
| 2006/0270201 | A1 | 11/2006 | Chua et al. |
| 2007/0092980 | A1 | 4/2007 | Han et al. |
| 2007/0152353 | A1 | 7/2007 | Park |
| 2007/0284607 | A1 | 12/2007 | Epler et al. |
| 2008/0054294 | A1 | 3/2008 | Lai et al. |
| 2008/0149917 | A1 | 6/2008 | Park |
| 2009/0001416 | A1 | 1/2009 | Chua et al. |
| 2010/0065812 | A1 | 3/2010 | Nakahara et al. |

OTHER PUBLICATIONS

X.Y. Guo et al., "Enhanced ultraviolet photoconductivity in porous GaN prepared by metal-assisted electroless etching," Elsevier, ScienceDirect, Solid State Communications, 140 (2006) pp. 159-162.

Xiuling Li et al., "In-plane bandgap control in porous GaN through electroless wet chemical etching," Applied Physics Letters, vol. 80, No. 6, Feb. 11, 2002, pp. 980-982.

Diego J. Diaz et al., "Morphology evolution and luminescence properties of porous GaN generated via Pt-assisted electroless etching of hydride vapor phase epitaxy GaN on sapphire," Journal of Applied Physics, val. 94, No. 12, Dec. 15, 2003, pp. 7526-7534.

H. Hartono et al., "Reduction of threading dislocation density in GaN grown on strain relaxed nanoporous GaN template," Applied Physics Letters 90, (2007) 171917-1 to 171917-3.

M. Mynbaeva et al., "Strain relaxation in GaN layers grown on porous GaN sublayers," MRS Internet Journal Nitride Semiconductor Research 4, 14 (1999), The Materials Research Society, pp. 1-5.

F. K. Yam et al., "Porous GaN prepared by UV assisted electrochemical etching," Elsevier, Science Direct, Thin Solid Films 515 (2007) pp. 3469-3474.

Patent Abstract of Japanese Application No. 2000188422A, Publication Date Jul. 4, 2000, 1 page.

EPO as ISA, International Search Report and Written Opinion dated Apr. 1, 2010 from International Application No. PCT/IB2009/051400 filed Feb. 4, 2009, 12 pages.

\* cited by examiner

FIG. 1
FIG. 2
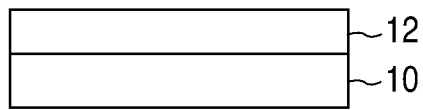
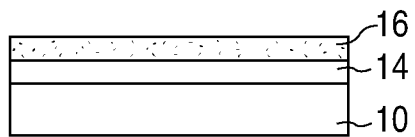
FIG. 3
FIG. 4
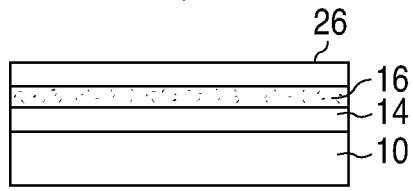
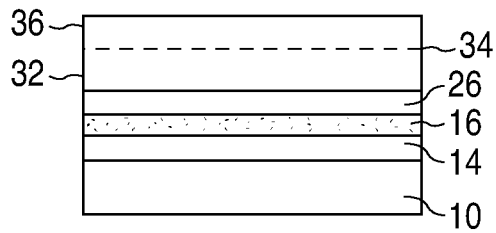
FIG. 5
FIG. 6
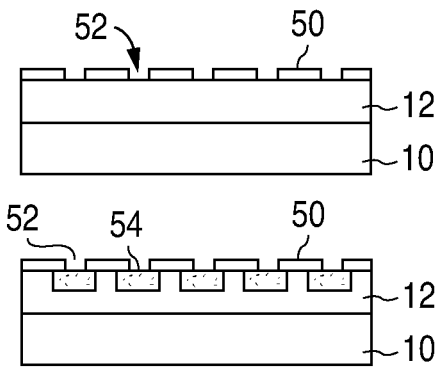
FIG. 7
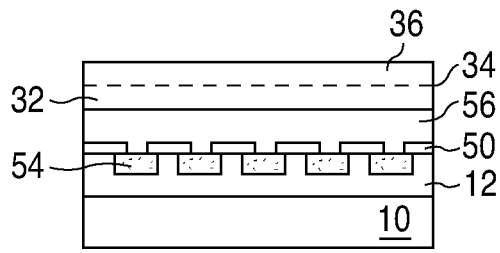
FIG. 8
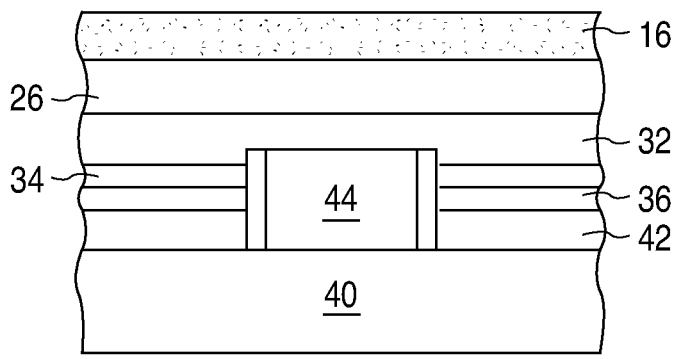

LIGHT EMITTING DEVICE INCLUDING POROUS SEMICONDUCTOR

CROSS REFERENCE TO RELATED APPLICATIONS

The present application is a continuation of U.S. patent application Ser. No. 15/170,161 filed on Jun. 1, 2016, which is a divisional of U.S. patent application Ser. No. 13/084,679 filed on Apr. 12, 2011, which issued as U.S. Pat. No. 9,385,265 on Jul. 5, 2016, which is a continuation of U.S. patent application Ser. No. 11/950,211 filed on Dec. 4, 2007, which issued as U.S. Pat. No. 7,928,448 on Apr. 19, 2011. U.S. patent application Ser. Nos. 15/170,161, 13/084,679 and 11/950,211 are incorporated herein.

BACKGROUND

Field of Invention

The present invention relates to a III-nitride light emitting device including a porous layer.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

SUMMARY

In accordance with embodiments of the invention, a semiconductor structure comprising a III-nitride light emitting layer disposed between an n-type region and a p-type region is grown over a porous III-nitride region. A III-nitride layer comprising InN is disposed between the light emitting layer and the porous III-nitride region. Since the III-nitride layer comprising InN is grown on the porous region, the III-nitride layer comprising InN may be at least partially relaxed, i.e. the III-nitride layer comprising InN may have an in-plane lattice constant larger than an in-plane lattice constant of a conventional GaN layer grown on sapphire.

BRIEF DESCRIPTION OF THE DRAWINGS

FIG. 1 is a cross sectional view of a III-nitride layer grown over a substrate.

FIG. 2 is a cross sectional view of a porous region formed in a III-nitride layer.

FIG. 3 is a cross sectional view of a relaxed III-nitride layer grown over a porous region.

FIG. 4 is a cross sectional view of a device structure grown over a relaxed III-nitride layer.

FIG. 5 is a cross sectional view of a mask formed on a III-nitride layer grown over a substrate.

FIG. 6 is a cross sectional view of porous regions formed through openings in a mask.

FIG. 7 is a cross sectional view of a relaxed III-nitride layer grown over the porous regions and the mask.

FIG. 8 is a cross sectional view of a portion of a III-nitride device mounted in flip chip configuration on a mount.

DETAILED DESCRIPTION OF THE PREFERRED EMBODIMENTS

Figure 9:
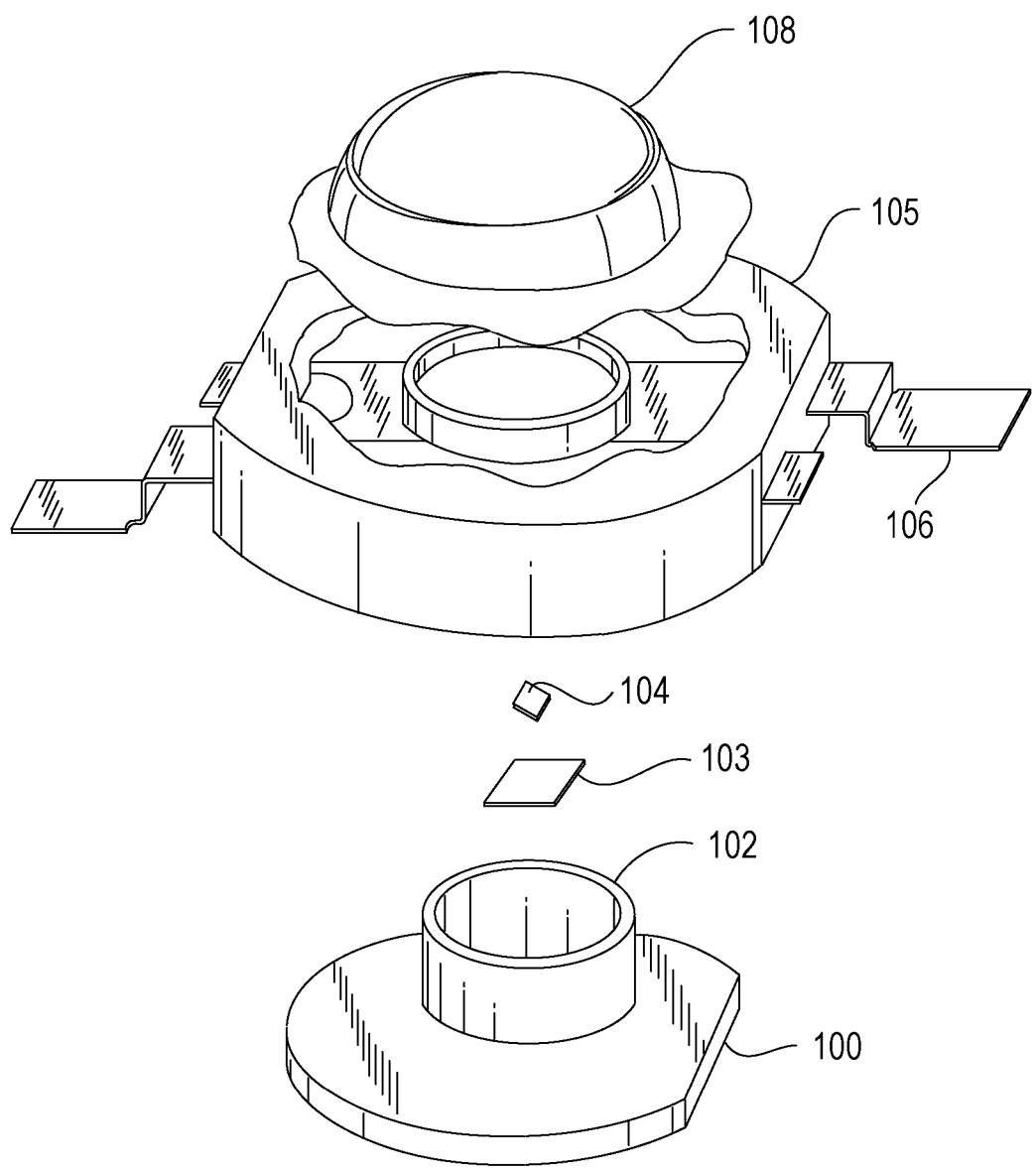
FIG. 9 is an exploded view of a packaged light emitting device.

The performance of a semiconductor light emitting device may be gauged by measuring the external quantum efficiency, which measures the number of photons extracted from the device per electron supplied to the device. The external quantum efficiency is the product of the internal quantum efficiency, defined as the number of photons produced per electron supplied to the device, and the extraction efficiency. The external quantum efficiency may be dominated by the internal quantum efficiency. For simplicity, radiative processes, non-radiative processes, and injection efficiency are all included in the internal quantum efficiency.

As the current density applied to a conventional III-nitride light emitting device increases, the internal quantum efficiency of the device initially increases, then decreases. As the current density increases past zero, the internal quantum efficiency increases, reaching a peak at a given current density (for example, at about 10 A/cm$^2$ for some devices). As current density increases beyond the peak, the internal quantum efficiency initially drops quickly, then the decrease slows at higher current density (for example, beyond 200 A/cm$^2$ for some devices). The internal quantum efficiency of a device also decreases as the InN composition in the light emitting region increases, which is required for longer wavelength devices in the III-nitride system.

Since native III-nitride growth substrates are generally expensive, not widely available, and impractical for growth of commercial devices, III-nitride devices are often grown on sapphire ($Al_2O_3$) or SiC substrates. III-nitride devices often include GaN, InGaN, and AlGaN layers. For devices that emit visible light, InGaN light emitting layers are often grown over GaN. There is a large lattice mismatch between GaN and the InGaN light emitting layers, resulting in strain in the light emitting layers. This strain limits the thickness and In percentage in the InGaN quantum well. Increasing the thickness of the light emitting layers in the device may increase the current density where the peak in efficiency occurs. This is advantageous for high-current and high-power operation. However, as the thickness and InN composition in the light emitting layers increases, the strain in the light emitting layers also increases. Reducing the strain in the light emitting layers may permit, for a given efficiency, growth of thicker light emitting layers and/or higher InN composition light emitting layers.

As used herein, an "in-plane" lattice constant refers to the actual lattice constant of a layer within the device, and a "bulk" lattice constant refers to the lattice constant of relaxed, free-standing material of a given composition. The amount of strain in a layer is defined in Eq. (1).

$$\text{strain} = \varepsilon = (a_{in\text{-}plane} - a_{bulk})/a_{bulk} \quad (1)$$

Note that strain, $\varepsilon$, in Eq. (1) can be either positive or negative, i.e., $\varepsilon > 0$ or $\varepsilon < 0$. In an unstrained film, $a_{in\text{-}plane} = a_{bulk}$, so $\varepsilon = 0$ in Eq. (1). A film where $\varepsilon > 0$ is said to be under tensile strain, or under tension, while a film where $\varepsilon < 0$ is said to be under compressive strain, or under compression. Examples of tensile strain include a strained AlGaN film grown over unstrained GaN, or a strained GaN film grown over unstrained InGaN. In both cases, the strained film has a bulk lattice constant that is smaller than the bulk lattice constant of the unstrained layer on which it is grown, so the in-plane lattice constant of the strained film is stretched to match that of the unstrained layer, giving $\varepsilon > 0$ in Eq. (1). Examples of compressive strain include a strained InGaN film grown over unstrained GaN, or a strained GaN film grown over unstrained AlGaN. In both cases, the strained film has a bulk lattice constant that is larger than the bulk lattice constant of the unstrained layer on which it is grown, so the in-plane lattice constant of the strained film is compressed to match that of the unstrained layer, giving $\varepsilon < 0$ in Eq. (1).

In a tensile film, the strain pulls the atoms apart from one another in order to increase the in-plane lattice constant. Tensile strain is often undesirable, because the film can respond to the tensile strain by cracking, which decreases the strain in the film, but compromises the structural and electrical integrity of the film. In a compressive film, the strain pushes the atoms together. This effect can reduce the incorporation of large atoms such as indium in an InGaN film, for example, or can negatively impact the material quality of the InGaN light emitting layer in an InGaN LED. In many cases, tensile and compressive strain are both undesirable, and it is beneficial to decrease the tensile or compressive strain in the various layers of the device. In such cases, it is more convenient to refer to the absolute value, or magnitude of the strain, as defined in Eq. (2). As used herein, the term "strain" shall be understood to mean the absolute value, or magnitude of the strain, as defined in Eq. (2).

$$\text{strain} = |\varepsilon| = |(a_{in\text{-}plane} - a_{bulk})|/a_{bulk} \quad (2)$$

In accordance with embodiments of the invention, a porous semiconductor region is included in a III-nitride light emitting device. The porous region may reduce the strain in layers grown over the porous region, particularly in the light emitting layer.

FIGS. 1-4 illustrate a first embodiment of a device including a porous region. As illustrated in FIG. 1, a III-nitride layer 12 is grown over a suitable growth substrate 10. III-nitride layer 12 is generally an n-type GaN layer that is not intentionally doped, though it may be an intentionally doped layer (generally n-type), and it may be a binary III-nitride material other than GaN, or a ternary or quaternary material such as InGaN, AlGaN, or AlInGaN. Substrate 10 may be, for example, GaN, sapphire, SiC, or a compound substrate such as SiC on Si or SiC on an insulator.

As illustrated in FIG. 2, all or a portion of layer 12 is made porous. Porous region 16 may be in contact with substrate 10, or may be separated from substrate 10 by a non-porous remaining portion 14 of III-nitride layer 12. In embodiments where a sapphire substrate is later removed by laser lift off, the entire thickness of layer 12 may be made porous such that porous material is in direct contact with substrate 10. Porous material at the interface with substrate 10 may reduce the laser power necessary for lift off and thereby reduce the amount of damage to the III-nitride material caused by the laser lift off process. For example, layer 12 may be made porous as follows: a platinum wire connected to layer 12 serves as the anode. The other end of the platinum wire serves as the cathode. The wafer and platinum wire are immersed in a 2M NaOH solution. A direct current is applied through the wire and wafer, for example at a density between 10 and 20 mA/cm$^2$. Optional UV-illumination is supplied by a 250 W mercury lamp. An appropriate porosity may require 10 to 60 minutes of processing, after which the lamp and the current source are switched off. Alternatively, platinum may be applied directly over the surface of the wafer, or different solutions such as KOH, fluoride acids, or $CH_3OH:HF:H_2O_2$ are used in a photo-electro-chemically driven process.

As taught by, for example, F. K. Yam et al., *Porous GaN prepared by UV assisted electrochemical etching*, Thin Solid Films 515 (2007) pp. 3469-3474, the density and size of the porosity may be controlled by varying the concentration of the solution. The etching almost exclusively occurs at the tips of the electrolyte-semiconductor interface (ends of the pores); therefore, by altering the solution during etching, a multilayer porosity may be created. To facilitate growth, a small pore layer at the surface of the template may be produced with a low molarity solution (0.5% KOH). Then, to increase the compliance of the template and thereby promote relaxation, a large pore layer beneath the surface may be produced with a high molarity solution (2% KOH). The small pore layer may be 30-150 nm in thickness and the large pore layer may be 100-4000 nm in thickness, limited by the stability of the porous material and the thickness of the nonporous material 14 beneath the porous region. If electrically conductive GaN is grown on an electrically conductive SiC substrate, porous GaN on porous SiC maybe created by continuing the etching process into the growth substrate, which may permits thinner template growth.

In porous region 16, air voids are formed in the III-nitride material. The voids may be on the order of tens to hundreds of nm in size, for example between 10 and 500 nm in size. Nearest neighbor voids may be spaced on the order of tens to hundreds of nm apart, for example between 10 and 500 nm apart. Porous region 16 may be, for example, between 0.02 and 3 μm thick. The percent porosity, defined as the volume of voids as a percent of the total volume of porous region 16, can vary from 20-80%, and is often greater than 50%.

A relaxed region 26 is grown over porous region 16, as illustrated in FIG. 3. In general, the composition of relaxed region 26 is selected to have a bulk lattice constant different from the bulk lattice constant of III-nitride layer 14. Region 26 has a bulk lattice constant that is closer to the bulk lattice constant of light emitting layer 34, as compared to III-nitride layer 14, which may reduce the strain in light emitting layer 34. In some embodiments the composition of relaxed region 26 is selected to have a bulk lattice constant larger than the bulk lattice constant of III-nitride layer 14, and often smaller than the bulk lattice constant of a later-grown light emitting layer. In other embodiments, the bulk lattice constant of relaxed region 26 is the same as the bulk lattice constant of a light emitting layer. Relaxed region 26 is often InGaN with an InN composition equal to or less than the InN composition in a light emitting layer, or AlInGaN.

Since relaxed region 26 is grown over the discontinuous top surface of porous region 16, region 26 is at least partially relaxed, and as such has an in-plane lattice constant different than the in-plane lattice constant of III-nitride layer region 14. Relaxed region 26 initially nucleates on the portions of III-nitride material between the voids in porous region 16, then quickly coalesces to form a planar layer, as illustrated in FIG. 3. If relaxed region 26 is InGaN, region 26 is grown thick enough to cover porous region 16. Higher pressure $NH_3$ flow may be used to prevent pits in relaxed region 26.

III-nitride device layers including an n-type region 32, a light emitting region 34, and a p-type region 36, are grown over relaxed region 26, as illustrated in FIG. 4.

N-type region 32 may include multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light. In some embodiments, at least a portion of relaxed region 26 closest to light emitting region 34 is doped n-type, and separate n-type region 32 is omitted.

Light emitting region 34 is grown over n-type region 32. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple InGaN light emitting layers, each with a thickness of 25 Å or less, separated by GaN or InGaN barriers, each with a thickness of 100 Å or less.

In some embodiments, the thickness of each of the light emitting layers in the device is thicker than 50 Å. In some embodiments, the light emitting region of the device is a single, thick light emitting layer with a thickness between 50 and 600 Å, more preferably between 100 and 250 Å. The optimal thickness may depend on the number of defects within the light emitting layer. The concentration of defects in the light emitting region is preferably limited to less than $10^9$ $cm^{-2}$, more preferably limited to less than $10^8$ $cm^{-2}$, more preferably limited to less than $10^7$ $cm^{-2}$, and more preferably limited to less than $10^6$ $cm^{-2}$.

In some embodiments, at least one light emitting layer in the device is doped with a dopant such as Si to a dopant concentration between $1\times10^{18}$ $cm^{-3}$ and $1\times10^{20}$ $cm^{-3}$. Si doping may further reduce the strain in the light emitting layer. In some embodiments, the light emitting layer or layers are not intentionally doped.

P-type region 36 is grown over light emitting region 34. Like the n-type region, the p-type region may include multiple layers of different composition, thickness, and dopant concentration, including layers that are not intentionally doped, or n-type layers.

The composition and thickness of n-type region 32 and p-type region 36 may depend on the composition of relaxed region 26 over which n-type region 32 is grown. The composition of relaxed region 26 is selected to relax the in-plane lattice constant as much as possible, in order to reduce the strain in the device layers, particularly in the light emitting region. If relaxed region 26 and light emitting region 34 have the same bulk lattice constant and all layers between relaxed region 26 and light emitting region 34 have the same in-plane lattice constant as relaxed region 26, there may be no strain in light emitting region 34.

In some embodiments, it may not be practical to completely eliminate strain in the light emitting region. In order to confine the electrons and holes that combine to create light within the light emitting region, the light emitting region is sandwiched between layers of higher band gap. In devices formed from binary and ternary III-nitride layers such as GaN and InGaN, the higher band gap layers sandwiching the light emitting region have less InN than the light emitting region, which means the higher band gap layers have smaller bulk lattice constants than the light emitting region. As a result, if the bulk lattice constants of region 26 and light emitting region 34 are matched to eliminate all strain in the light emitting region, these higher band gap layers sandwiching the light emitting region will be under tensile strain. As the thickness of a layer under tensile strain increases, the layer will eventually crack, or relax, creating defects. Thus, the amount of tensile strain may undesirably limit the thickness to which n- and p-type regions 32 and 36 may be grown.

In the case of an InGaN region 26 and InGaN light emitting layer, the bulk lattice constant and therefore the composition of relaxed region 26 is selected to include as much InN as possible in order to reduce the strain in the light emitting layer as much as possible, while keeping the InN composition in relaxed region 26 low enough that n-type region 32 and p-type region 36 can be grown without cracking at compositions suitable for confining carriers and thicknesses suitable for spreading current from the n- and p-contacts. In some embodiments, n-type region 32 is at least 300 nm thick, such that current spreads efficiently through the n-type region for a distance of at least 50 µm.

In some embodiments, n-type region 32 may include one or more InGaN layers, or may include one or more Si-doped layers, in order to reduce the amount of tensile strain and thereby increase the thickness at which n-type region 32 may be grown without cracking. In some embodiments, n-type layer 32 has the same composition as relaxed region 26, thus n-type layer 32 may be grown to arbitrary thickness, since there is little or no strain in n-type layer 32. The light emitting layers may also have the same composition as relaxed region 26 and n-type region 32, such that there is little or no strain in the light emitting region. Alternatively, the light emitting layers may have a different composition than n-type region 32. The presence of some strain in the light emitting region may improve the internal quantum efficiency and therefore the performance of some device structures.

In a first example, first III-nitride region 12 is GaN, relaxed region 26 is an $In_{0.05}Ga_{0.95}N$ region 26 up to 100 nm thick, n-type region 32 is a single $In_{0.05}Ga_{0.95}N$ layer, and light emitting region 34 includes at least one $In_{0.15}Ga_{0.85}N$ quantum well layer, a light emitting layer that typically emits blue light. The strain in the $In_{0.15}Ga_{0.85}N$ quantum well layer may be less than the strain in a quantum well layer of the same composition and thickness grown in a conventional device.

In a second example, first III-nitride region 12 is GaN, relaxed region 26 is an $In_{0.1}Ga_{0.9}N$ region 26 up to 50 nm thick, n-type region 32 is a single $In_{0.1}Ga_{0.9}N$ layer, and light emitting region 34 includes at least one $In_{0.2}Ga_{0.8}N$ quantum well layer, a light emitting layer that typically emits green light. The strain in the $In_{0.2}Ga_{0.8}N$ quantum well layer may be less than the strain in a quantum well layer of the same composition and thickness grown in a conventional device.

In a third example, first III-nitride region 12 is GaN, relaxed region 26 is an $In_{0.1}Ga_{0.9}N$ region 26 up to 50 nm thick, n-type region 32 is a single $In_{0.1}Ga_{0.9}N$ layer, and light emitting region 34 includes at least one $In_{0.15}Ga_{0.85}N$ quantum well layer, a light emitting layer that typically emits blue light. The quantum well layer is sandwiched by thin barrier layers with a larger band gap than the quantum well layer. The barrier layers may be InGaN with a lower InN composition than the quantum well layer, or GaN, grown to a thickness below the critical thickness. In this example, the $In_{0.15}Ga_{0.85}N$ quantum well layer has a bulk lattice constant that is close to that of relaxed region 26 and n-type layer 32, which may reduce the strain in the quantum well layer.

In a fourth example, first III-nitride region 12 is GaN, relaxed region 26 is an $In_{0.05}Ga_{0.95}N$ region 26 up to 100 nm thick, n-type region 32 is a single $In_{0.05}Ga_{0.95}N$ layer, and light emitting region 34 includes at least one $In_{0.15}Ga_{0.85}N$ quantum well layer, a light emitting layer that typically emits blue light. The quantum well layer is sandwiched by thin barrier layers with a larger band gap than the quantum well layer. The barrier layers may be InGaN with a lower InN composition than the quantum well layer, or GaN, grown to a thickness below the critical thickness. P-type layer 36 is $In_{0.05}G_{0.95}N$.

Figure 10:
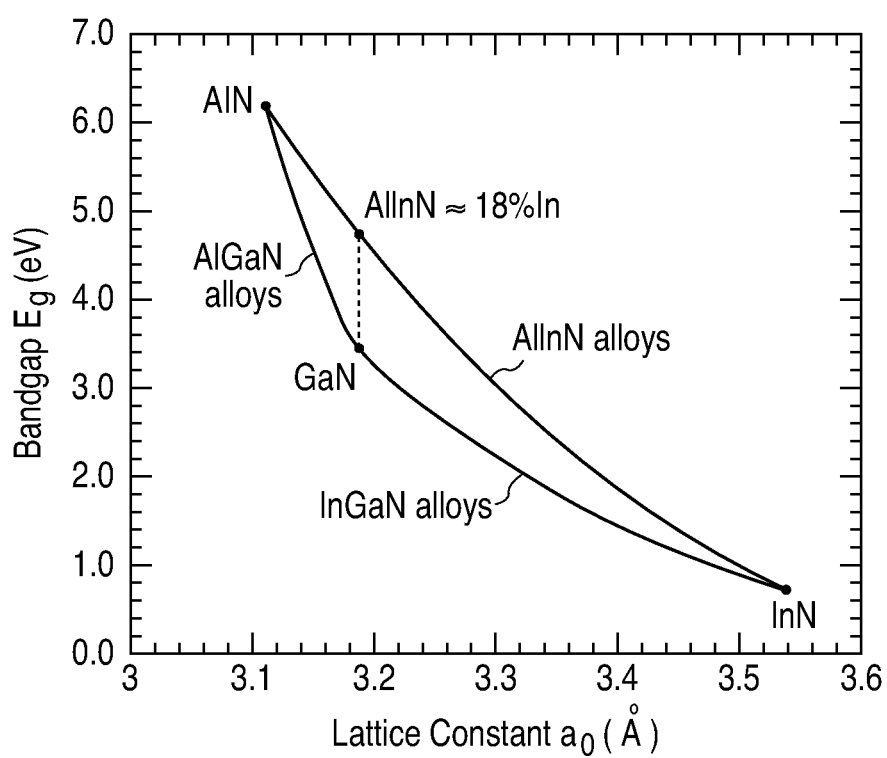
FIG. 10 is a plot of bandgap as a function of lattice constant for InGaN, AlGaN and AlInN alloys.

Another material that can be used as wider bandgap layers to sandwich lower bandgap InGaN light emitting layers is AlInN. By tuning the AlN and InN compositions, AlInN can be lattice matched to InGaN, with a wider bandgap than InGaN. This is illustrated in FIG. 10, which is a plot of bandgap as a function of lattice constant for GaN, AlGaN, InGaN and AlInN. For example, $Al_{0.82}In_{0.18}N$ is lattice matched to GaN but has a wider bandgap (~4.8 eV) than GaN (~3.4 eV). AlInN layers formed on at least one side of the light emitting layer may provide lattice matching and carrier confinement in the light emitting layer without excessive optical absorption in the layers sandwiching the light emitting layer.

In a fifth example, first III-nitride region 12 is GaN, relaxed region 26 is an $In_{0.15}Ga_{0.85}N$ region 26 up to 50 nm thick, n-type region 32 is a single AlInN layer with an InN composition chosen to lattice-match an $In_{0.15}Ga_{0.85}N$ light emitting layer, a composition that typically emits blue light. Because the layers beneath the light emitting layer are relaxed, there is no strain in the $In_{0.15}Ga_{0.85}N$ light emitting layer. P-type region 36 includes at least one AlInN lattice-matched layer and at least one strained GaN layer. To reduce optical absorption in the device, relaxed $In_{0.15}Ga_{0.85}N$ region 26 may be removed in later processing. Alternatively, relaxed region 26 and n-type region 32 may have a slightly lower InN concentration than the light emitting layer, to provide some strain in the $In_{0.15}Ga_{0.85}N$ light emitting layer, but considerably less than a $In_{0.15}Ga_{0.85}N$ light emitting layer conventionally grown over GaN.

FIGS. 5-7 illustrate a second embodiment of a device including a porous region. As illustrated in FIG. 5, a mask 50 is formed over the surface of a III-nitride layer 12 grown over a growth substrate, described above in reference to FIG. 1. Openings 52 are formed in mask 50 by conventional patterning techniques. Mask 50 may be, for example, SiN, $SiO_2$, Ti, or TiW, and may be at least 4 nm thick. Openings 52 may vary in size. For example, openings 52 may be a 1-dimensional pattern, such as stripes, or a 2-dimensional pattern, such as holes. The stripe width or hole diameter may be 2 µm or less, more preferably less than 500 nm, to reduce the amount of lateral growth necessary for the next-grown layer to coalesce over mask 50. Openings 52 may be spaced 4 µm apart or less, more preferably 1 µm apart or less. Large openings may be formed by standard optical lithography. Sub-micron features may be formed by lithography techniques such as imprint or holography, or by stepper-scanners.

Portions 54 of III-nitride layer 12 are made porous through openings 52 in mask 50, as illustrated in FIG. 6.

Portions 54 may be made porous by one of the techniques described above in reference to FIG. 2. Porous portions 54 are confined to the area directly beneath openings 52 in mask 50. In an alternative embodiment, a porous region is formed before mask 50, then a relaxed region is formed over mask 50.

In FIG. 7, a planar region 56 is grown over mask 50 and the porous regions 54 exposed through the holes 52 in mask 50, for example by a technique such as epitaxial lateral overgrowth. Since region 56 initially nucleates on porous regions 54, region 56 may be at least partially relaxed, as described above in reference to FIG. 3. Initial conditions for growth of region 56 favor the formation of pyramids of material, forcing any defects to bend away from the surface of porous region 54. The growth conditions are then switched to conditions favoring lateral growth. Defects in the crystal may be bent during the pyramid growth, then annihilate during the lateral growth, which may reduce the number of defects that occur from growing on a porous layer. After region 56 has coalesced, the growth conditions may be switched to conditions that favor normal vertical growth. A device structure, including an optional n-type region 32, a light emitting region 34, and a p-type region 36, as described above in reference to FIG. 4, is then grown over relaxed region 56.

The light emitting layers in the embodiments described above may have larger in-plane a-lattice constants than light emitting layers grown in conventional devices, which typically have in-plane a-lattice constants no larger than 3.1885 Å. Growth of the light emitting layer over a strain-relieved layer at least partially relaxed by a porous layer may increase the in-plane lattice constant to greater than 3.189 Å. In some embodiments, the in-plane a-lattice constant in the light emitting layer may be increased to at least 3.195 Å, more preferably to at least 3.2 Å.

An InGaN layer that emits blue light may have the composition $In_{0.12}Ga_{0.88}N$, a composition with a bulk lattice constant of 3.23 Å. In the case of a conventional $In_{0.12}Ga_{0.88}N$ layer, the strain is (3.189 Å–3.23 Å)/3.23 Å, about 1.23%. If a light emitting layer of the same composition is grown according to the embodiments described above, the strain may be reduced or eliminated. In some embodiments of the invention, the strain in the light emitting layer of a device emitting light between 430 and 480 nm may be reduced to less than 1%, and more preferably to less than 0.5%. An InGaN layer that emits cyan light may have the composition $In_{0.16}Ga_{0.84}N$, a composition with strain of about 1.7% when grown in a conventional device. In some embodiments of the invention, the strain in the light emitting layer of a device emitting light between 480 and 520 nm may be reduced to less than 1.5%, and more preferably to less than 1%. An InGaN layer that emits green light may have the composition $In_{0.2}Ga_{0.8}N$, a composition with a free standing lattice constant of 3.26 Å, resulting in strain of about 2.1% when grown in a conventional device. In some embodiments of the invention, the strain in the light emitting layer of a device emitting light between 520 and 560 nm may be reduced to less than 2%, and more preferably to less than 1.5%.

The semiconductor structures illustrated and described above may be included in any suitable configuration of a light emitting device, such as a device with contacts formed on opposite sides of the device or a device with both contacts formed on the same side of the device. When both contacts are disposed on the same side, the device may be formed either with transparent contacts and mounted such that light is extracted either through the same side on which the contacts are formed, or with reflective contacts and mounted as a flip chip, where light is extracted from the side opposite the side on which the contacts are formed. In devices where light is extracted through the surface on which the contacts are formed, since current does not spread as readily in p-type III-nitride material as in n-type III-nitride material, the contact may include a small, thick, absorbing metal bond pad formed over a thin, transparent current spreading layer. The current spreading layer may be, for example, a thin layer of Ni and/or Au, indium tin oxide, Cu-doped InO, ZnO, Ga-doped ZnO, or any other suitable doped, transparent oxide.

FIG. 8 illustrates a portion of one example of a suitable configuration, a flip chip device from which the growth substrate has been removed. A portion of p-type region 36 and light emitting region 34 is removed to form a mesa that exposes a portion of n-type region 32. Though one via exposing n-type region 32 is shown in FIG. 8, it is to be understood that multiple vias may be formed in a single device. N- and p-contacts 44 and 42 are formed on the exposed parts of n-type region 32 and p-type region 36, for example by evaporating or plating. Contacts 42 and 44 may be electrically isolated from each other by air or a dielectric layer.

After contact metals 42 and 44 are formed, a wafer of devices may be diced into individual devices, then each device may be flipped relative to the growth direction and mounted on a mount 40, in which case mount 40 may have a lateral extent larger than that of the device. Alternatively, a wafer of devices may be connected to a wafer of mounts, then diced into individual devices. Mount 40 may be, for example, semiconductor such as Si, metal, or ceramic such as AlN, and may have at least one metal pad (not shown) which electrically connects to p-contacts 42 and at least one metal pad (not shown) which electrically connects to the n-contacts 44. Interconnects (not shown) such as solder or gold stud bumps, connect the semiconductor device to mount 40. Inter-metal dielectrics may be formed on or within mount 40 to electrically isolate the p-type and n-type current paths.

After mounting, the growth substrate is removed by a process suitable to the substrate material, such as etching or laser melting. For example, porous region 16 can be selectively etched to lift off the substrate. A rigid underfill may be provided between the device and mount 40 before or after mounting to support the semiconductor layers and prevent cracking during substrate removal. A portion of the semiconductor structure may be removed by thinning after removing the substrate. For example, porous region 16 and III-nitride region 26 may remain in the finished device, as shown in FIG. 8, or they may be removed by thinning. The exposed surface of the semiconductor structure may be roughened, for example by an etching process such as photoelectrochemical etching or by a mechanical process such as grinding. Roughening the surface from which light is extracted may improve light extraction from the device. Alternatively, a photonic crystal structure may be formed in the top surface of the semiconductor structure exposed by removing the grown substrate. A structure such as a phosphor layer or secondary optics known in the art such as dichroics or polarizers may be applied to the emitting surface.

FIG. 9 is an exploded view of a packaged light emitting device, as described in more detail in U.S. Pat. No. 6,274, 924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Though the embodiments above describe reducing the strain in a device with InGaN light emitting layers, the techniques and structures described herein may also be used to reduce strain in a device with AlGaN light emitting layers, which typically emit UV light.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A device comprising:
   a semiconductor structure comprising a light emitting layer disposed between an n-type region and a p-type region;
   a porous region;
   a first layer disposed between the light emitting layer and the porous region, the first layer having a bulk lattice constant larger than a bulk lattice constant of material in the porous region;
   a mask layer disposed between the porous region and the first layer; and
   a plurality of openings formed in the mask layer.

2. The device of claim 1 wherein the porous region is divided into a plurality of regions, each of the plurality of porous regions being aligned with an opening in the mask layer.

3. The device of claim 2 wherein the porous regions are separated by regions of nonporous material having the same composition as the porous regions.

4. The device of claim 1 further comprising:
   a first contact electrically connected to the n-type region; and
   a second contact electrically connected to the p-type region.

5. The device of claim 1 further comprising a substrate, wherein at least a portion of the substrate is porous.

6. The device of claim 1, wherein the mask layer comprises SiN, $SiO_2$, Ti, or TiW.

7. The device of claim 1, wherein the mask layer is at least 4 nm thick.

8. The device of claim 1, wherein the plurality of openings formed in the mask layer are one-dimensional.

9. The device of claim 1, wherein the plurality of openings formed in the mask layer are two-dimensional.

* * * * *